US012730166B2

(12) United States Patent
Cao et al.

(10) Patent No.: US 12,730,166 B2
(45) Date of Patent: Sep. 8, 2026

(54) MAGNETIC RESONANCE SYSTEM AND POWER SUPPLY DEVICE FOR MAGNETIC RESONANCE SYSTEM

(71) Applicant: GE Precision Healthcare LLC, Waukesha, WI (US)

(72) Inventors: Zhenen Cao, Beijing (CN); Yu Liu, Beijing (CN); Tao Ma, Beijing (CN)

(73) Assignee: GE Precision Healthcare LLC, Waukesha, WI (US)

( * ) Notice: Subject to any disclaimer, the term of this patent is extended or adjusted under 35 U.S.C. 154(b) by 419 days.

(21) Appl. No.: 18/485,275

(22) Filed: Oct. 11, 2023

(65) Prior Publication Data

US 2024/0125875 A1 Apr. 18, 2024

(30) Foreign Application Priority Data

Oct. 12, 2022 (CN) ......................... 202211249713.2

(51) Int. Cl.

*G01R 33/36* (2006.01)
*G01R 33/54* (2006.01)
*H02M 3/00* (2006.01)
*H02M 3/335* (2006.01)

(52) U.S. Cl.

CPC ......... *G01R 33/36* (2013.01); *G01R 33/3614* (2013.01); *G01R 33/543* (2013.01); *H02M 3/01* (2021.05); *H02M 3/33569* (2013.01)

(58) Field of Classification Search

CPC .. G01R 33/36; G01R 33/3614; G01R 33/543; G01R 33/48; H02M 3/01; H02M 3/33569; H02M 1/0064; H02M 1/123; H02M 1/008; H02M 7/103; H02M 3/1586; H02M 3/07; H02M 3/158; H02M 1/0095; H02M 7/53871; H02M 7/4815; A61B 5/055

See application file for complete search history.

(56) References Cited

U.S. PATENT DOCUMENTS 11,114,932 B1 * 9/2021 Gataric ................. H02M 1/126
2012/0287678 A1 * 11/2012 Xu ........................ H02M 3/158 363/21.02
2014/0097844 A1 * 4/2014 Tomiha ............. G01R 33/3692 324/321
2015/0115954 A1 * 4/2015 Song ................. G01R 33/3607 324/303

(Continued)

*Primary Examiner* — Rishi R Patel
(74) *Attorney, Agent, or Firm* — Fletcher Yoder, P.C.

(57) ABSTRACT

Embodiments of the present invention disclose a magnetic resonance system and a power supply device for the magnetic resonance system, the device including: a DC power source; a full-bridge circuit coupled to the DC power source and having a first bridge arm and a second bridge arm, the full-bridge circuit being used to output a periodic voltage signal through the first bridge arm and the second bridge arm; a resonant circuit, having a symmetrical circuit structure, two symmetric input terminals thereof being connected to the first bridge arm and the second bridge arm, respectively, so as to receive the periodic voltage signal; and a boost circuit, connected to two symmetric output terminals of the resonant circuit so as to receive the periodic voltage signal modulated by the resonant circuit, the boost circuit being used to provide a boosted voltage, and the boosted voltage having an amplitude greater than the amplitude of the periodic voltage signal.

14 Claims, 10 Drawing Sheets

(56) References Cited

U.S. PATENT DOCUMENTS

| | | | | |
|---|---|---|---|---|
| 2020/0200845 | A1* | 6/2020 | Gu | G01R 33/3607 |
| 2021/0288583 | A1* | 9/2021 | Hirakawa | H02M 3/07 |
| 2022/0140722 | A1* | 5/2022 | Park | H02M 1/007 363/142 |

* cited by examiner

MAGNETIC RESONANCE SYSTEM AND POWER SUPPLY DEVICE FOR MAGNETIC RESONANCE SYSTEM

CROSS REFERENCE TO RELATED APPLICATIONS

The present application claims priority and benefit of Chinese Patent Application No. 202211249713.2 filed on Oct. 12, 2022, which is incorporated herein by reference in its entirety.

TECHNICAL FIELD

Embodiments of the present invention generally relate to power supply technology, and, in particular, relate to a magnetic resonance (MR) system and a power supply device for the magnetic resonance system.

BACKGROUND

In a magnetic resonance system, a high-voltage power source module is typically disposed in an equipment room isolated from a magnet room, so as to avoid being affected by a magnetic field created by a main magnet disposed in the magnet room. With the development of magnetic resonance technology, more and more operating modules are disposed in the magnet room and integrated with the main magnet. When it is necessary to provide an operating voltage to some operating modules (loads) in the magnet room, very long cables are typically required to transmit electrical energy generated by the high-voltage power source in the equipment room to the loads in the magnet room. The foregoing cables are typically connected to a through-wall panel that is disposed on a wall between the two rooms. To reduce interference and transmission loss, it is necessary to provide a filter on the through-wall panel to filter a voltage signal.

Cables, filters, etc., all result in increased production costs and maintenance costs, and are not advantageous for further integration of the system. Furthermore, the cost of the high-voltage power source itself is also relatively high.

SUMMARY

An aspect of the present invention provides a power supply device for a magnetic resonance system, comprising: a DC power source; a full-bridge circuit coupled to the DC power source and having a first bridge arm and a second bridge arm, the full-bridge circuit being used to output a periodic voltage signal through the first bridge arm and the second bridge arm; a resonant circuit, having a symmetrical circuit structure, two symmetric input terminals thereof being connected to the first bridge arm and the second bridge arm, respectively, so as to receive the periodic voltage signal; and a boost circuit, connected to two symmetric output terminals of the resonant circuit so as to receive the periodic voltage signal modulated by the resonant circuit, the boost circuit being used to provide a boosted voltage, and the boosted voltage having an amplitude greater than the voltage of the periodic voltage signal.

Another aspect of the present invention provides a magnetic resonance system, comprising: a main magnet; a radio frequency coil; a radio frequency control link, comprising at least one of a radio frequency transmit link and a radio frequency receive link; and a power supply device, used to supply power to one or more loads in the radio frequency control link.

BRIEF DESCRIPTION OF THE DRAWINGS

The described and other features, aspects, and advantages of the present invention will be better understood once the following detailed description has been read with reference to the accompanying drawings. In the accompanying drawings, the same reference signs are used to represent the same components throughout the accompanying drawings, in which.

DETAILED DESCRIPTION

Specific embodiments of the present invention will be described in detail below with reference to the accompanying drawings in order to assist those skilled in the art to understand exactly the subject matter set forth in the present invention. In the following detailed description of the following specific embodiments, the present specification does not describe in detail any of the known functions or configurations to prevent unnecessary details from affecting the disclosure of the present invention.

Unless otherwise defined, the technical or scientific terms used in the claims and the description should be as they are usually understood by those possessing ordinary skill in the technical field to which they belong. Terms such as "first," "second" and similar terms used in the present description and claims do not denote any order, quantity, or importance, but are only intended to distinguish different constituents. The terms "one" or "a/an" and similar terms do not express a limitation of quantity, but rather that at least one is present. The terms "include" or "comprise" and similar words indicate that an element or object preceding the terms "include" or "comprise" encompasses elements or objects and equivalent elements thereof listed after the terms "include" or "comprise", and do not exclude other elements or objects. The terms "connect" or "link" and similar words are not limited to physical or mechanical connections, and are not limited to direct or indirect connections. Furthermore, it should be understood that references to "an embodiment" or "embodiments" of the present disclosure are not intended to be construed as excluding the existence of additional implementations that also incorporate the referenced features.

A "module" as described herein may be implemented using software, hardware, or a combination of software and hardware. For example, in accordance with some aspects of the embodiments of the present invention, the "modules" described herein may be implemented as computer program modules or circuit modules.

Figure 1:
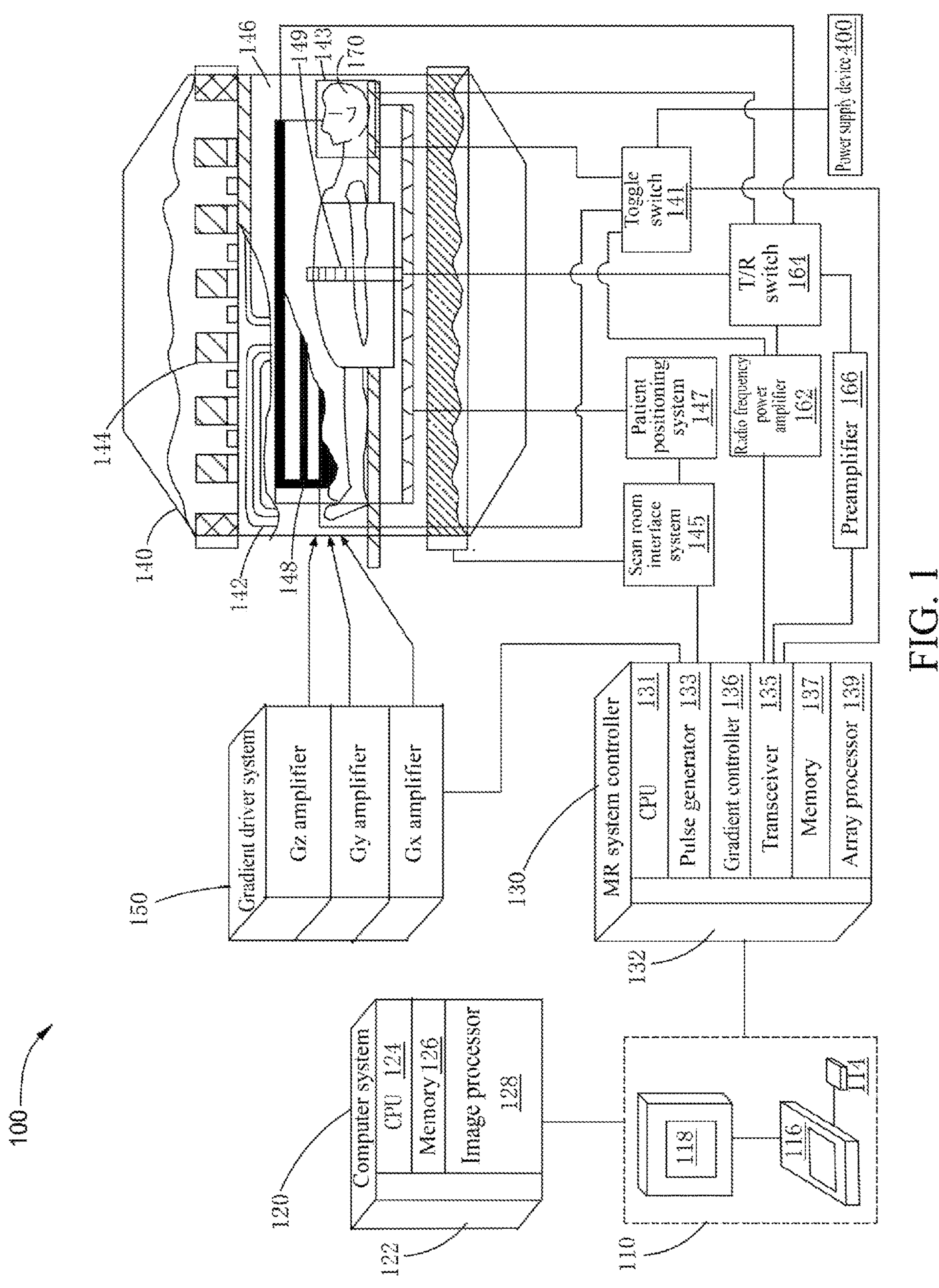
FIG. 1 illustrates an exemplary magnetic resonance (MR) system 100 according to some embodiments of the present invention.

Referring to FIG. 1, an exemplary magnetic resonance (MR) system 100 according to some embodiments of the present invention is illustrated. An operator workstation 110 is used to control the operation of the MR system 100, the operator workstation 110 including an input apparatus 114, a control panel 116, and a display 118. The input apparatus 114 may be a joystick, a keyboard, a mouse, a trackball, a touch-activated screen, voice control, or any similar or equivalent input apparatus. The control panel 116 may include a keyboard, a touch-activated screen, voice control, a button, a slider, or any similar or equivalent control apparatus. The operator workstation 110 is coupled to and communicates with a computer system 120, and provides an interface to allow an operator to plan a magnetic resonance scan, display an image, perform image processing, and store data and images.

The computer system 120 includes a plurality of modules that communicate with one another by means of an electrical and/or data connection module 122. The connection module 122 may be a wired communication link, an optical fiber communication link, a wireless communication link, and the like. The computer system 120 may include a central processing unit (CPU) 124, a memory 126, and an image processor 128. In some embodiments, the image processor 128 may be replaced by an image processing function run in the CPU 124. The computer system 120 may be connected to an archive media apparatus, a persistent or backup memory, or a network. The computer system 120 may be coupled to and communicates with a separate MR system controller 130.

The MR system controller 130 includes a set of modules that communicate with one another by means of an electrical and/or data connection module 132. The connection module 132 may be a direct wired communication link, an optical fiber communication link, a wireless communication link, and the like. In an alternative embodiment, modules of the computer system 120 and the MR system controller 130 may be implemented on the same computer system or on a plurality of computer systems. The MR system controller 130 may include a CPU 131, a sequence pulse generator 133 that communicates with the operator workstation 110, a transceiver (or an RF transceiver) 135, a gradient controller 136, a memory 137, and an array processor 139.

A subject 170 of the MR scan may be positioned within a cylindrical imaging volume 146 of a resonance assembly 140. The resonance assembly 140 includes a superconducting magnet having a superconducting coil 144, a radio frequency coil assembly, and a gradient coil assembly 142. During operation, the superconducting coil 144 provides a static uniform longitudinal magnetic field $B_0$ throughout the cylindrical imaging volume 146. The radio frequency coil assembly may include a body coil 148 and a surface coil 149, and may be used to send and/or receive a radio frequency signal. The radio frequency coil assembly may further include a local coil 143, for example, a head coil.

The radio frequency body coil 148 and the local coil 143 may connect to a toggle switch 141, which is controlled by the MR system controller 130 to toggle the radio frequency body coil 148 and the local coil 143.

The MR system controller 130 may receive a command from the operator workstation 110 to indicate an MR scan sequence that is to be executed during an MR scan. The "scan sequence" above refers to a combination of pulses that have specific intensities, shapes, time sequences, and the like and that are applied when a magnetic resonance imaging scan is executed. The pulses may typically include, for example, a radio frequency pulse and a gradient pulse. A plurality of scan sequences may be prestored in the computer system 120, so that a sequence suitable for clinical examination requirements can be indicated by means of the operator workstation. The clinical examination requirements may include, for example, an imaging site, an imaging function, an imaging effect, and the like. The pulse generator 133 of the MR system controller 130 sends, on the basis of the indicated sequence, an instruction describing the timings, intensities, and shapes of a radio frequency pulse and a gradient pulse in the sequence so as to operate a system component that executes the sequence.

A radio frequency pulse in the scan sequence sent by the pulse generator 133 may be generated by the transceiver 135, and the radio frequency pulse is amplified by a radio frequency power amplifier 162. When the toggle switch 141 is toggled to the body coil 148, the amplified radio frequency pulse is provided to the body coil 148 through a transmit/receive switch (T/R switch) 164, and the RF body coil 148 then provides a transverse magnetic field $B_1$. The transverse magnetic field $B_1$ is substantially perpendicular to $B_0$ throughout the entire cylindrical imaging volume 146. The transverse magnetic field $B_1$ is used to excite stimulated nuclei in the body of the scan subject so as to generate an MR signal. When the toggle switch 141 is toggled to the local coil 143, the amplified radio frequency pulse is provided to the local coil 143, so as to provide the transverse magnetic field $B_1$ via the local coil 143.

The gradient pulse in the scan sequence sent by the pulse generator 133 may be generated by the gradient controller 136 and acts on a gradient driver 150. The gradient driver 150 includes $G_x$, $G_y$, and $G_z$ amplifiers, and the like. Each of the $G_x$, $G_y$, and $G_z$ gradient amplifiers is used to excite a corresponding gradient coil in the gradient coil assembly 142, so as to generate a magnetic field gradient used to spatially encode an MR signal during an MR scan.

The pulse generator 133 is coupled to and communicates with a scan room interface system 145 that can receive signals from various sensors associated with the state of the resonance assembly 140, and various processors arranged in a scan room. The scan room interface system 145 is further coupled to and communicates with a patient positioning system 147, the patient positioning system 147 sending and receiving a signal to control the movement of a patient table to a desired position to perform the MR scan.

As described above, the RF body coil 148, the local coil 143, and the RF surface coil 149 may be used to transmit radio frequency pulses and/or receive MR signals from the scan subject. The MR signals emitted by excited nuclei in the body of the scan subject may be sensed and received by the RF body coil 148, the local coil 143 or the RF surface coil 149, and then sent back to a preamplifier 166 by means of the T/R switch 164. The T/R switch 164 may be controlled by a signal from the MR system controller 130 to electrically connect, during a transmit mode, the radio frequency power amplifier 162 to the RF body coil 148 and to connect, during a receive mode, the preamplifier 166 to the RF body coil 148. The T/R switch 164 may further enable the RF surface coil 149 and the local coil 143 to be used in the transmit mode or the receive mode.

In some embodiments, the MR signals sensed and received by the RF body coil 148, the local coil 143, or the RF surface coil 149 and amplified by the preamplifier 166 are demodulated, filtered and digitized in a receiving portion of the transceiver 135, and transmitted as a raw k-space data array to the memory 137 in the MR system controller 130.

As a non-limiting example, a transmitting portion in the transceiver 135, the radio frequency power amplifier 162, the toggle switch 141, the T/R switch 164, and the like shown in FIG. 1 constitute at least a portion of a radio frequency transmit link. In some embodiments, the radio frequency transmit link may further include a decoupled switch (not shown in the figure) to provide decoupling or signal isolation between the RF body coil 148, the local coil 143, or the RF surface coil 149 and a receive loop during radio frequency transmission. Furthermore, the receiving portion in the transceiver 135, the preamplifier 166, the T/R switch 164, and the like shown in FIG. 1 constitute at least a portion of a radio frequency receive link. One or more modules/elements/assemblies of the radio frequency transmit link and the radio frequency receive link are integrated in the resonance assembly, and as loads, require high-voltage power supply during operation; for example, one or more such loads may be supplied with an operating voltage by means of the power supply device 400 or 700 of the present invention. Although FIG. 1 shows only an example of the power supply device 400 supplying power to the toggle switch 141, it can be understood that the power supply device 400 or 700 may also supply power to other loads, or an additional power supply device 400 or 700 may be provided to supply power to other loads.

A reconstructed magnetic resonance image may be obtained by transforming/processing the stored raw k-space data. For each image to be reconstructed, the data is rearranged into separate k-space data arrays, and each of said separate k-space data arrays is inputted to the array processor 139, the array processor being operated to transform the data into an array of image data by Fourier transform.

The array processor 139 uses transform methods, most commonly Fourier transform, to create images from the received MR signals. These images are transmitted to the computer system 120 and stored in the memory 126. In response to commands received from the operator workstation 110, the image data may be stored in a long-term memory, or may be further processed by the image processor 128 and transmitted to the operator workstation 110 for presentation on the display 118.

In various embodiments, components of the computer system 120 and MR system controller 130 may be implemented on the same computer system or on a plurality of computer systems. It should be understood that the MR system 100 shown in FIG. 1 is intended for illustration. Suitable MR systems may include more, fewer, and/or different components.

The MR system controller 130 and the image processor 128 may separately or collectively include a computer processor and a storage medium. The storage medium records a program for predetermined data processing and that is to be executed by the computer processor. For example, the storage medium may store a program used to implement scanning processing (such as a scan flow and an imaging sequence), image reconstruction, image processing, and the like. The described storage medium may include, for example, a ROM, a floppy disk, a hard disk, an optical disk, a magneto-optical disk, a CD-ROM, or a non-volatile memory card.

Figure 2:
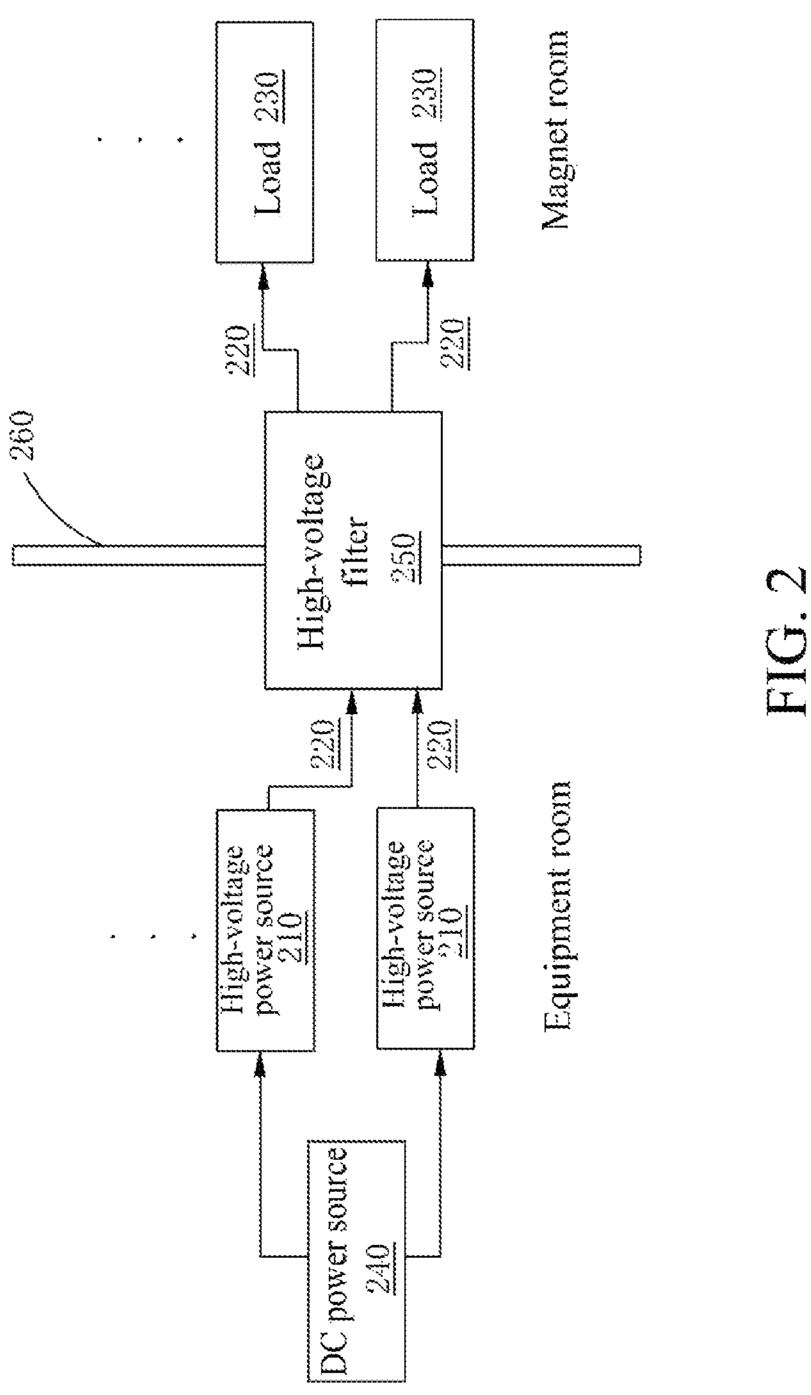
FIG. 2 is a schematic diagram of high-voltage power supply to the described loads in the magnet room in the prior art.

FIG. 2 is a schematic diagram of high-voltage power supply to the described loads in the magnet room in the prior art, wherein a plurality of high-voltage power sources 210 are disposed in the equipment room and transfer generated high voltages to the magnet room by means of cables 220 to supply voltages to corresponding loads 230, the plurality of high-voltage power sources 210 receiving a control voltage outputted by a DC power source 240 and outputting high voltages of hundreds or thousands of volts to supply to the corresponding loads 230, and thus complex cable connections are formed at the periphery of the resonance assembly. The described cables 220 additionally need to be filtered by a high-voltage filter 250 before access to the magnet room. The high-voltage filter is disposed on a through-wall panel 260 between the equipment room and the magnet room.

Figure 3:
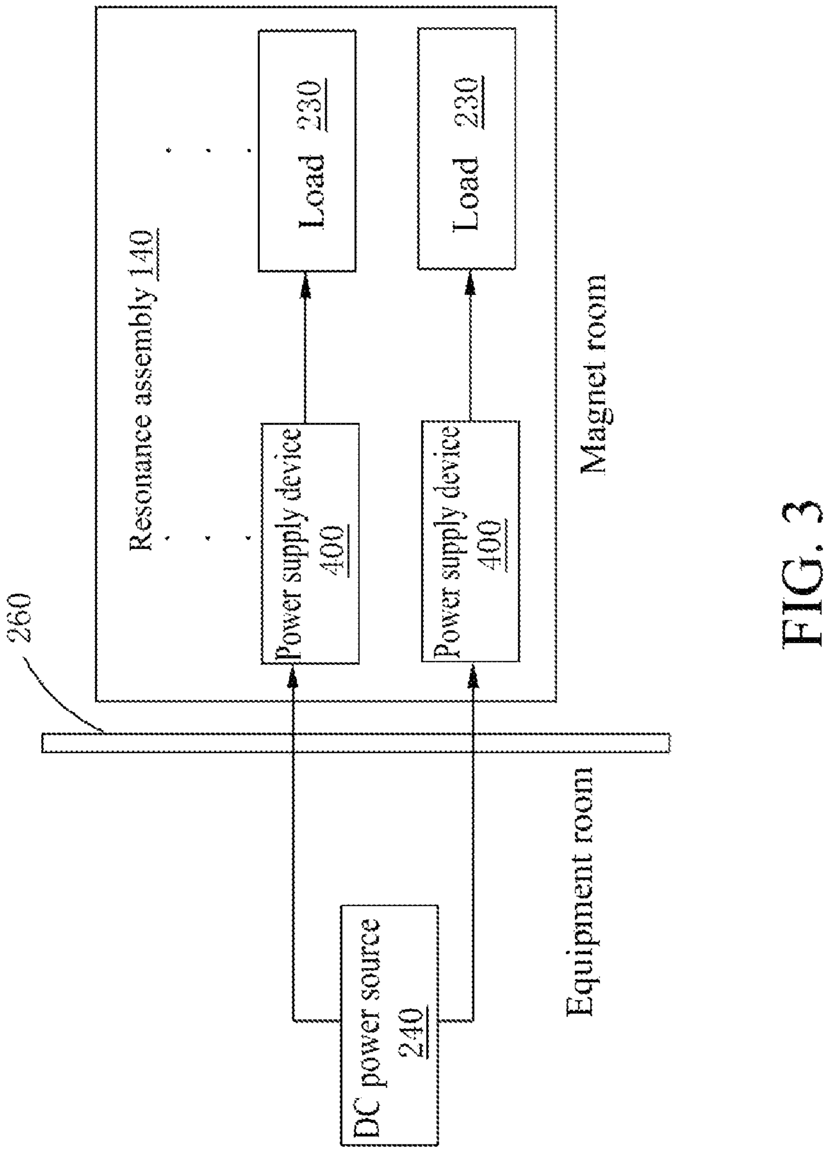
FIG. 3 illustrates a schematic diagram of high-voltage power supply to the described loads in one embodiment of the present invention.

FIG. 3 illustrates a schematic diagram of high-voltage power supply to the described loads according to an embodiment of the present invention, wherein one or more power supply devices 400 are provided directly in the magnet room to supply power to the one or more loads 230. Specifically, a power supply device 400 may be integrated together with the resonance assembly 140, for example, disposed on a circuit board between the magnet and a housing. In a solution of the present invention, the described cables from the equipment room to the magnet room are no longer needed, and the corresponding high-voltage filter on the through-wall panel 260 is also no longer needed.

Figure 4:
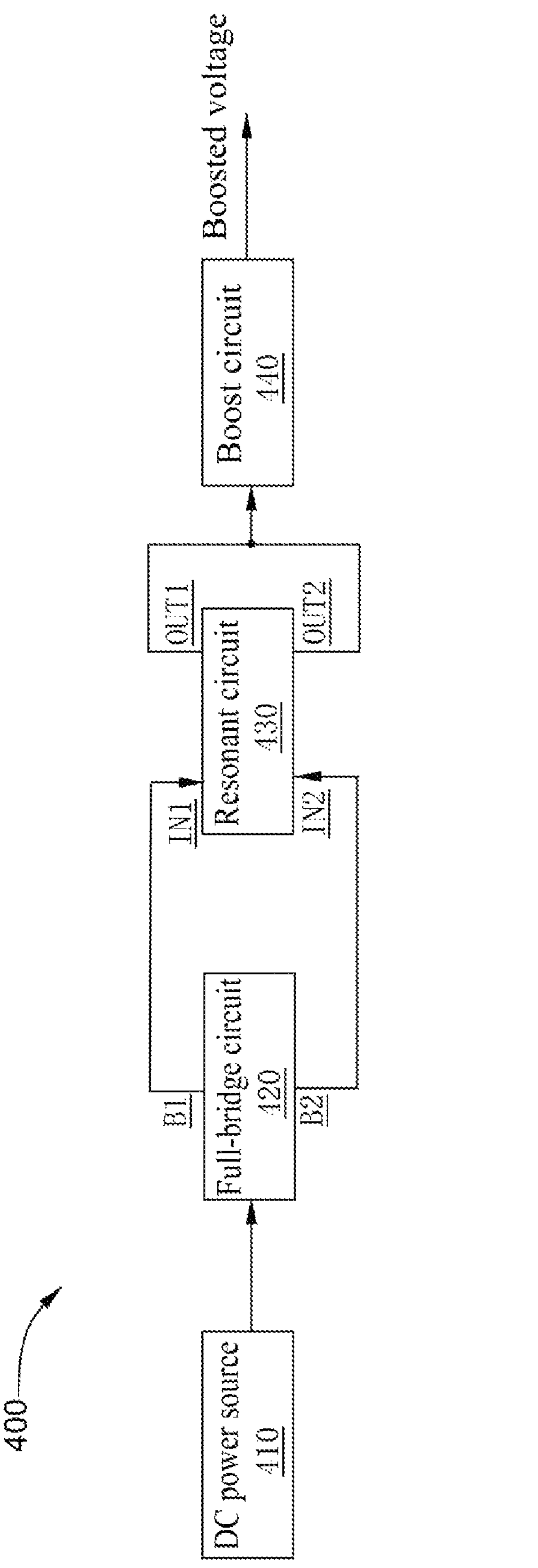
FIG. 4 illustrates a block diagram of a power supply device 400 for a magnetic resonance system according to one embodiment of the present invention.

FIG. 4 illustrates a block diagram of a power supply device 400 for a magnetic resonance system according to one embodiment of the present invention. The power supply device 400 includes a DC power source 410, a full-bridge circuit 420, a resonant circuit 430 and a boost circuit 440. The full-bridge circuit 420 is coupled to the DC power source 410. The full-bridge circuit 420 has a first bridge arm B1 and a second bridge arm B2, which each serve as output terminals of the full-bridge circuit 420. The full-bridge circuit 420 is used to output a periodic voltage signal through the first bridge arm B1 and the second bridge arm B2. Those skilled in the art will understand that the full-bridge circuit 420 may include four switching elements that are connected to one another to make the form of a "bridge," wherein a connection route between two switching elements is a first bridge arm, and a connection route between the other two switching elements is a second bridge arm. The described periodic voltage signal refers to a signal having a voltage amplitude that changes repeatedly over time.

In one example, the periodic voltage signal may be generated on the basis of control of the full-bridge circuit by a controller, which will not described in detail here, and will be described in detail below with reference to FIGS. 8-10.

The resonant circuit 430 has a symmetrical circuit structure, and has two symmetric input terminals IN1 and IN2, which are connected to the first bridge arm B1 and the second bridge arm B2, respectively, so as to receive the periodic voltage signal. The resonant circuit 430 is used to modulate the periodic voltage signal, for example, to modulate a periodic square wave signal to a sinusoidal wave signal. The resonant circuit has two symmetric output terminals OUT1 and OUT2 for outputting the modulated periodic voltage signal.

The boost circuit 440 is connected to the two output terminals OUT1 and OUT2 so as to receive the periodic voltage signal modulated by the resonant circuit 430, and the boost circuit 440 is used to provide a boosted voltage, the boosted voltage having an amplitude greater than the amplitude of the periodic voltage signal. Specifically, the boost circuit 440 is used to convert the received periodic voltage signal to the boosted voltage.

In the described embodiments of the present invention, signal modulation is performed by means of using the resonant circuit on the voltage signal generated by the full-bridge circuit, and a boost conversion is performed by the boost circuit on the basis of the periodic voltage signal, such that the power supply device 400 can provide an output voltage meeting the needs of the loads and provide a high load power without using a transformer, so as to avoid being affected by the magnetic field environment in which the power supply device 400 is located, and thus enabling the power supply device 400 to be securely disposed in the magnet room and close to the main magnet. In this way, dependence on cables is avoided, product design is simplified, and overall costs are greatly reduced.

Additionally, the symmetrical structure of the resonant circuit 430 enables the removal or reduction of common mode interference or noise, reducing the impact on the quality of the imaging of the magnetic resonance system.

Figure 5:
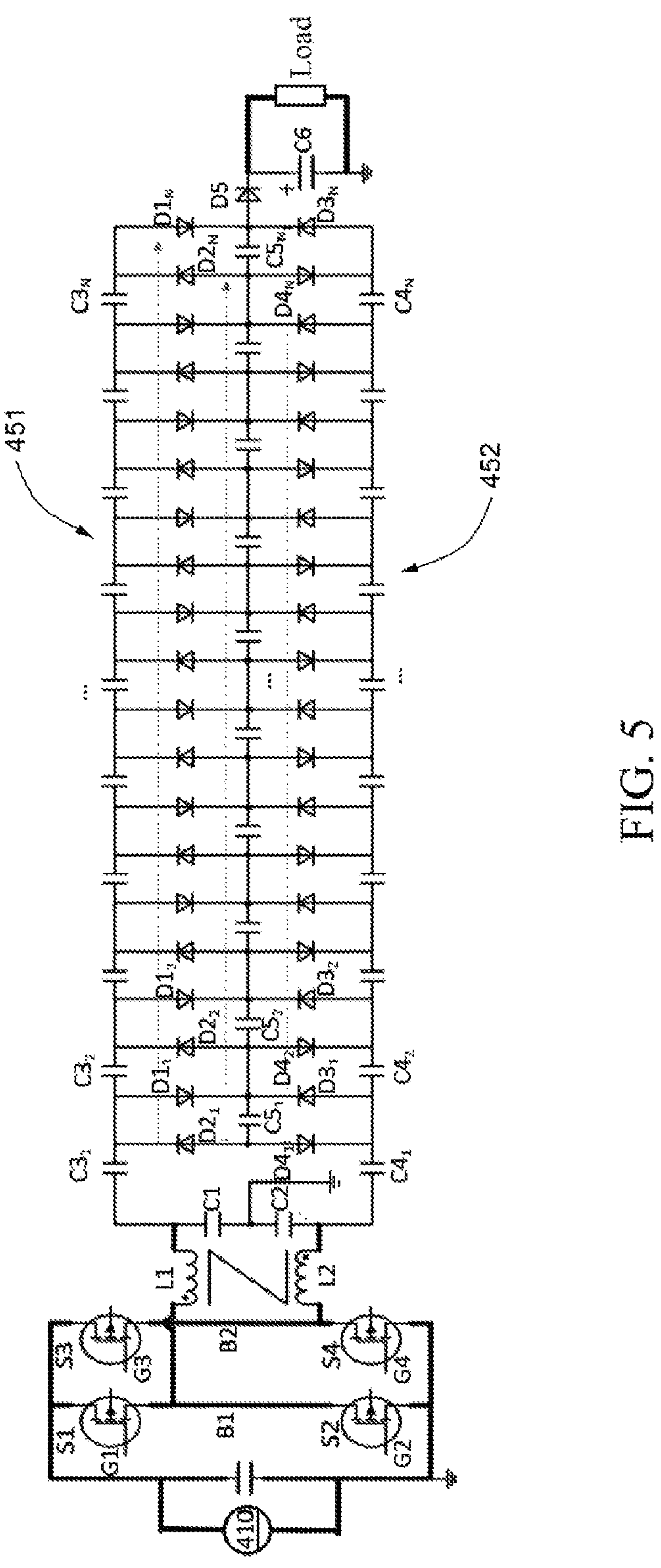
FIG. 5 illustrates a schematic circuit diagram of an embodiment of the power supply device 400 of FIG. 4.

FIG. 5 is a schematic circuit diagram of an embodiment of the power supply device 400 of FIG. 4, wherein the full-bridge circuit 420 includes four field-effect transistor switches S1-S4, sources of the field-effect transistor switches S1 and S3 being connected to a positive electrode of the DC power source 410, drains of the field-effect transistor switches S2 and S4 being connected to a negative electrode of the DC power source 410, a drain of the field-effect transistor switch S1 and a source of the field-effect transistor switch S2 being connected to form the first bridge arm B1, and a drain of the field-effect transistor switch S3 and a source of the field-effect transistor switch S4 being connected to form the second bridge arm B2.

The resonant circuit 430 includes a first inductor L1, a first capacitor C1, a second capacitor C2, and a second inductor L2 that are connected sequentially in series. Specifically, one end of the first inductor L1 and one end of the second inductor L2 act as the two input terminals IN1 and IN2, respectively, and are connected to the first bridge arm $B_1$ and the second bridge arm B2. The other end of the first inductor L1 is connected sequentially in series to the first capacitor C1 and the second capacitor C2, and then connected to the other end of the second inductor L2, and the other ends of the first inductor L1 and the second inductor L2 serve as the two symmetric output terminals OUT1 and OUT2 of the resonant circuit 430, respectively. A connection node of the first capacitor C1 and the second capacitor C2 is grounded.

In some embodiments, the first inductor L1 and the second inductor L2 are identical, and the first capacitor C1 and the second capacitor C2 are identical.

In the described embodiments, a pair of inductors and a pair of capacitors are used to connect to form a resonant circuit having a symmetrical structure, and common mode interference and noise are effectively reduced by means of a simple design.

In one embodiment, the first inductor L1 and the second inductor L2 are coupled to one another to form an integrated coupled inductor L to further reduce interference. Specifically, the first inductor and the second inductor may be wound to form the coupled inductor L.

Figure 6:
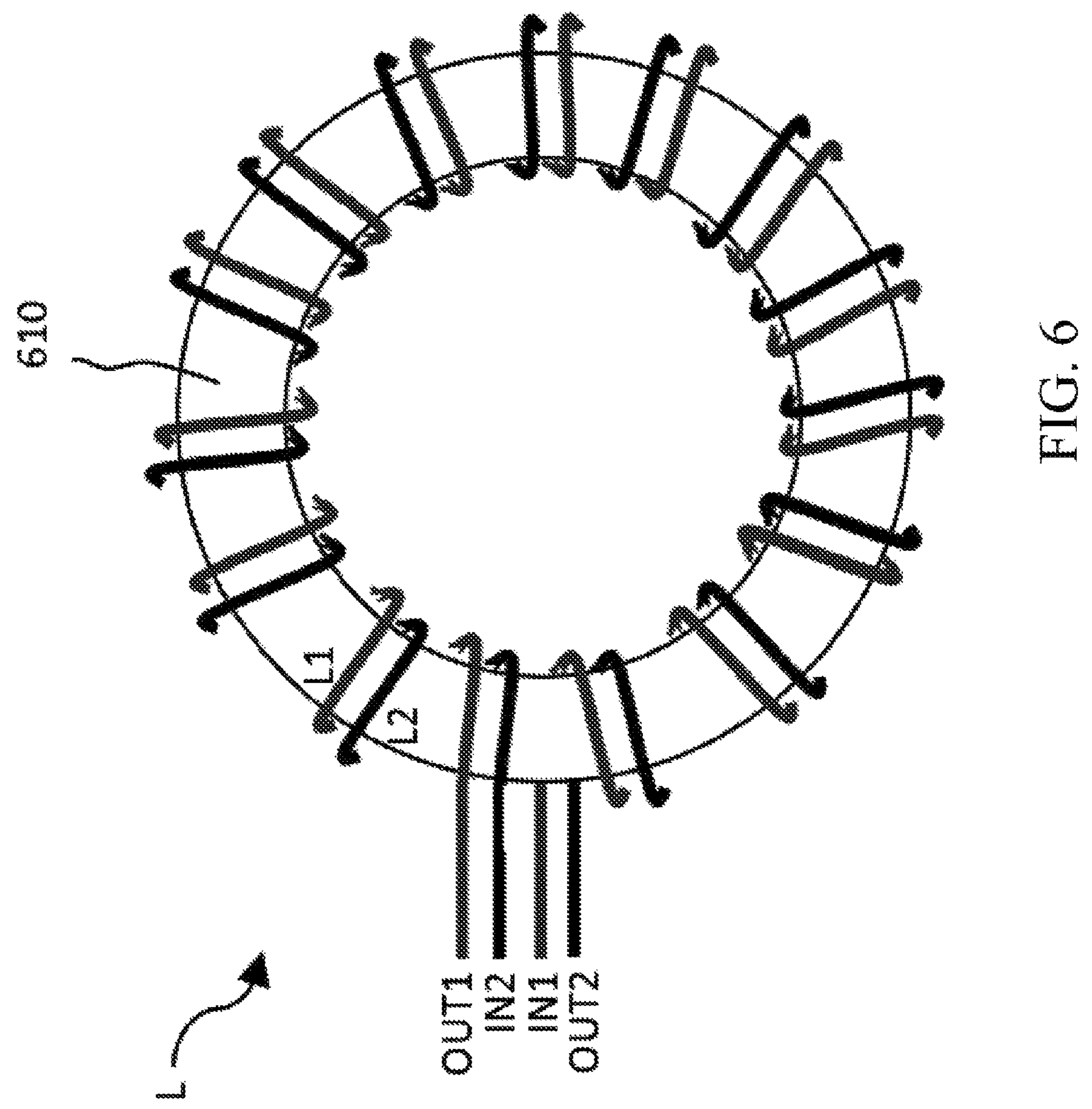
FIG. 6 is a schematic structural diagram of one embodiment of a coupled inductor L.

FIG. 6 is a schematic structural diagram of one embodiment of the coupled inductor L, wherein the first inductor L1 and the second inductor L2 are wound and extended to form a ring shape, the first inductor and the second inductor remaining parallel. Specifically, the coupled inductor L includes an annular carrier 610 one end of the first inductor L1 and one end of the second inductor L2 being disposed at two adjacent initial positions, respectively, and the other ends thereof returning to ending positions close to the starting positions after being wound from the starting positions along the entire periphery of the annular carrier 610 in multiple turns, thereby forming a ring-shaped coupled inductor, wherein the first inductor L1 and the second inductor L2 are always disposed in parallel.

By means of using a coupled inductor of such a structure, the coupling has high efficiency and is easy to implement.

With continued reference to FIG. 5, the boost circuit 440 includes a symmetrical circuit structure including a first boost portion 451 and a second boost portion 452. The first boost portion 451 and the second boost portion 452 are connected to the two output terminals OUT1 and OUT2 of the resonant circuit 430, respectively. That is, the first boost portion 451 is connected to a connection node between the first inductor L1 and the first capacitor C1, and the second boost portion 452 is connected to a connection node between the second inductor L2 and the second capacitor C2. The first boost portion 451 and the second boost portion 452 are used to generate divided voltages of the boosted voltage.

In one embodiment, the first boost portion 451 includes a plurality of third capacitors that are connected in series, $C3_1$~$C3_N$, and the second boost portion 452 includes a plurality of fourth capacitors that are connected in series, $C4_1$~$C4_N$. N is an integer greater than 1. A positive electrode of a first third capacitor $C3_1$ is connected to the connection node between the first inductor L1 and the first capacitor C1, and a negative electrode thereof is connected to a positive electrode of the next third capacitor $C3_2$, and so on. A positive electrode of a first fourth capacitor $C4_1$ is connected to the connection node between the second inductor L2 and the second capacitor C2, and a negative electrode thereof is connected to a positive electrode of the next fourth capacitor $C4_2$, and so on.

In one embodiment, the first boost portion 451 may further include a plurality of first diodes $D1_1$~$D1_N$, a plurality of second diodes $D2_1$~$D2_N$, and a plurality of fifth capacitors $C5_1$~$C5_N$. N is an integer greater than 1. The second boost portion 452 may further include a plurality of third diodes $D3_1$~$D3_N$, a plurality of fourth diodes $D4_1$~$D4_N$, and the described plurality of fifth capacitors $C5_1$~$C5_N$.

A negative electrode of each of the third capacitors $C3_1$~$C3_N$ is correspondingly connected to an anode of one first diode and a cathode of one second diode, and one fifth capacitor is correspondingly connected between a cathode of the one first diode and an anode of the one second diode.

A negative electrode of each of the fourth capacitors $C4_1$~$C4_N$ is correspondingly connected to an anode of one third diode and a cathode of one fourth diode, and one fifth capacitor is correspondingly connected between a cathode of the one third diode and an anode of the one fourth diode.

A cathode of each first diode $D1_1$~$D1_N$ and one corresponding third diode $D3_1$~$D3_N$ are connected and then correspondingly connected to a positive electrode of one fifth capacitor, and an anode of each second diode $D2_1$~$D2_N$ and one corresponding fourth diode $D4_1$~$D4_N$ are connected and then correspondingly connected to a negative electrode of one fifth capacitor.

Each third capacitor corresponds to one fourth capacitor, for example, the third capacitors $C3_1$~$C3_N$ and the fourth capacitors $C4_1$~$C4_N$ have a one-to-one correspondence. A negative electrode of a fourth capacitor corresponding to each third capacitor is correspondingly connected to an anode of one third diode and a cathode of one fourth diode, and the same fifth capacitor is correspondingly connected between a cathode of the one third diode and an anode of the one fourth diode. For example, the third capacitors $C3_1$~$C3_N$, the fourth capacitors $C4_1$~$C4_N$, the first diodes $D1_1$~$D1_N$, the second diodes $D2_1$~$D2_N$, the third diodes $D3_1$~$D3_N$, and the fourth diodes $D4_1$~$D4_N$ each have a one-to-one correspondence with the fifth capacitors $C5_1$~$C5_N$.

The periodic voltage signal modulated by the resonant circuit 430 may first charge the third capacitor $C3_1$ and fourth capacitor $C4_1$, and after fully charging the third capacitor $C3_1$ and fourth capacitor $C4_1$, the first diode $D1_1$ and third diode $D3_1$ are turned on, such that the fifth capacitor $C5_1$ is then charged. After full charging, the second diode $D2_1$ and fourth diode $D4_1$ are turned on, such that the next third capacitor $C3_2$ and fourth capacitor $C4_2$ are then charged. After full charging, the next set of the first diode $D1_2$ and the third diode $D3_2$ are turned on, such that the next fifth capacitor $C5_2$ is charged, and so on, until the last third capacitor $C3_N$, fourth capacitor $C4_N$, and fifth capacitor $C5_N$ are fully charged, and the voltages applied on all the third capacitors $C3_1$~$C3_N$, fourth capacitors $C4_1$~$C4_N$ and fifth capacitors $C5_1$~$C5_N$ are superposed, such that the amplitude of the voltage of the raw periodic voltage signal is increased.

In this way, the first boost portion and the second boost portion are enabled to produce divided voltages having higher amplitudes, and the amplitude of the boosted voltage is also enabled to be higher, so as to meet a higher voltage requirement. Additionally, by means of configuring the boost circuit as a symmetrical structure, on the basis of meeting the higher voltage requirement, the symmetry and stability of the boost circuit can be met and common mode interference can be reduced.

With continued reference to FIG. 5, the power supply device 400 further includes an energy storage capacitor C6 having a high capacitance. Both the first boost portion 451 and the second boost portion 452 are connected to a positive electrode of the energy storage capacitor C6 so as to provide the boosted voltage to the energy storage capacitor, such that the energy storage capacitor can store electrical energy, so as to power a load connected in parallel between two electrodes of the energy storage capacitor.

Furthermore, the first boost portion and the second boost portion are connected to the energy storage capacitor C6 by means of a fifth diode D5 (i.e., a fifth diode D5 is connected between the boost circuit 450 and the energy storage capacitor C6), the fifth diode D5 being turned on when the boosted voltage generated by the boost circuit 450 is sufficiently high, so as to charge the energy storage capacitor C6.

Figure 7:
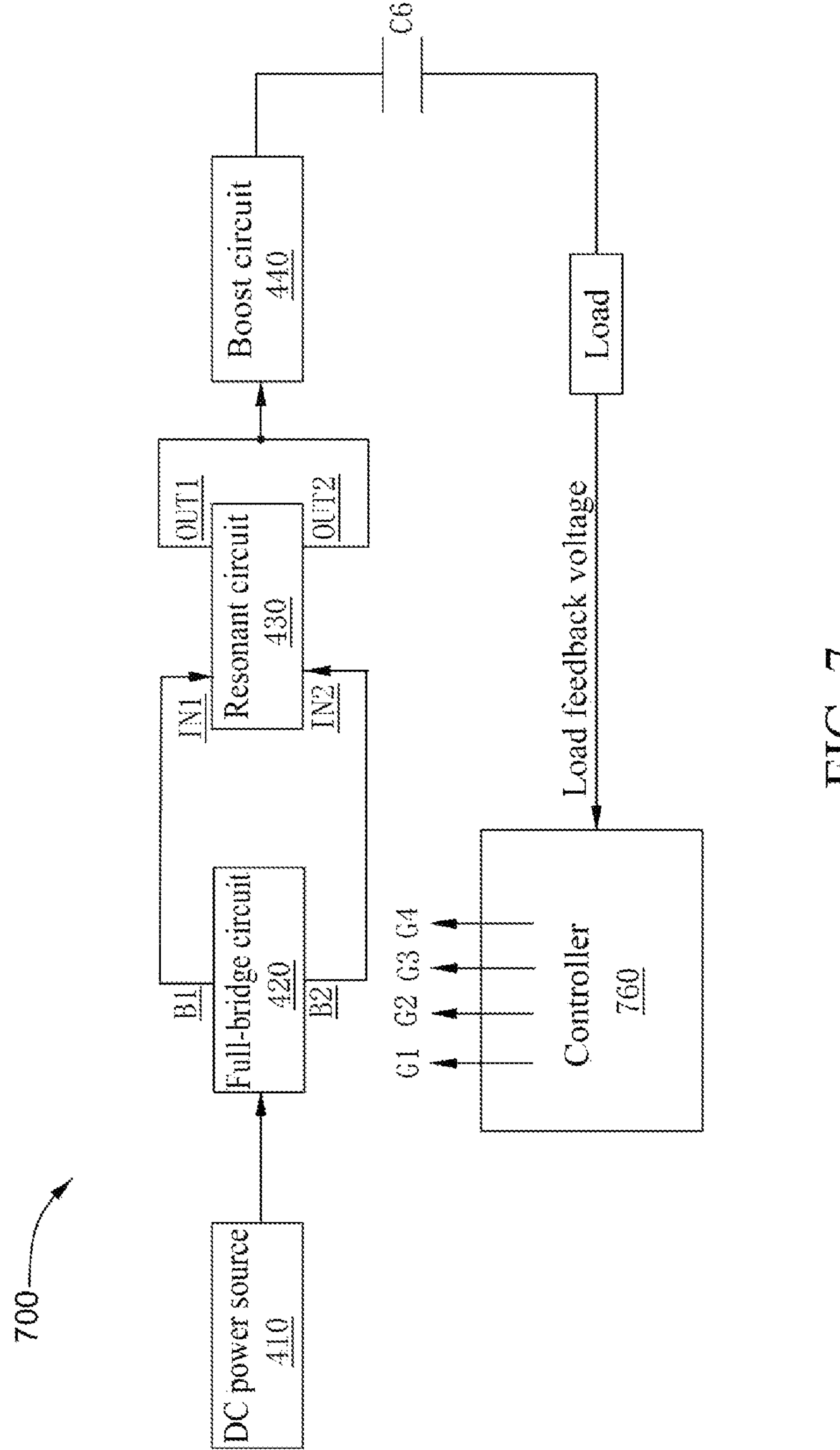
FIG. 7 illustrates a block diagram of a power supply device 700 according to another embodiment of the present invention.

With reference to FIG. 7, a block diagram of a power supply device 700 according to another embodiment of the present invention is illustrated, further including a controller 760, the controller 760 being used to control the full-bridge circuit to output the periodic voltage signal. Specifically, the controller 760 may be a pulse width modulation (PWM) controller, and includes four drive ends G1-G4 that are connected to gates of the field-effect transistor switches S1-S4, respectively. The controller 760 controls the on/off state of the field-effect transistor switches S1-S4, so as to enable the full-bridge circuit to output the periodic voltage signal on the basis of the voltage requirement of the load.

Figure 8:
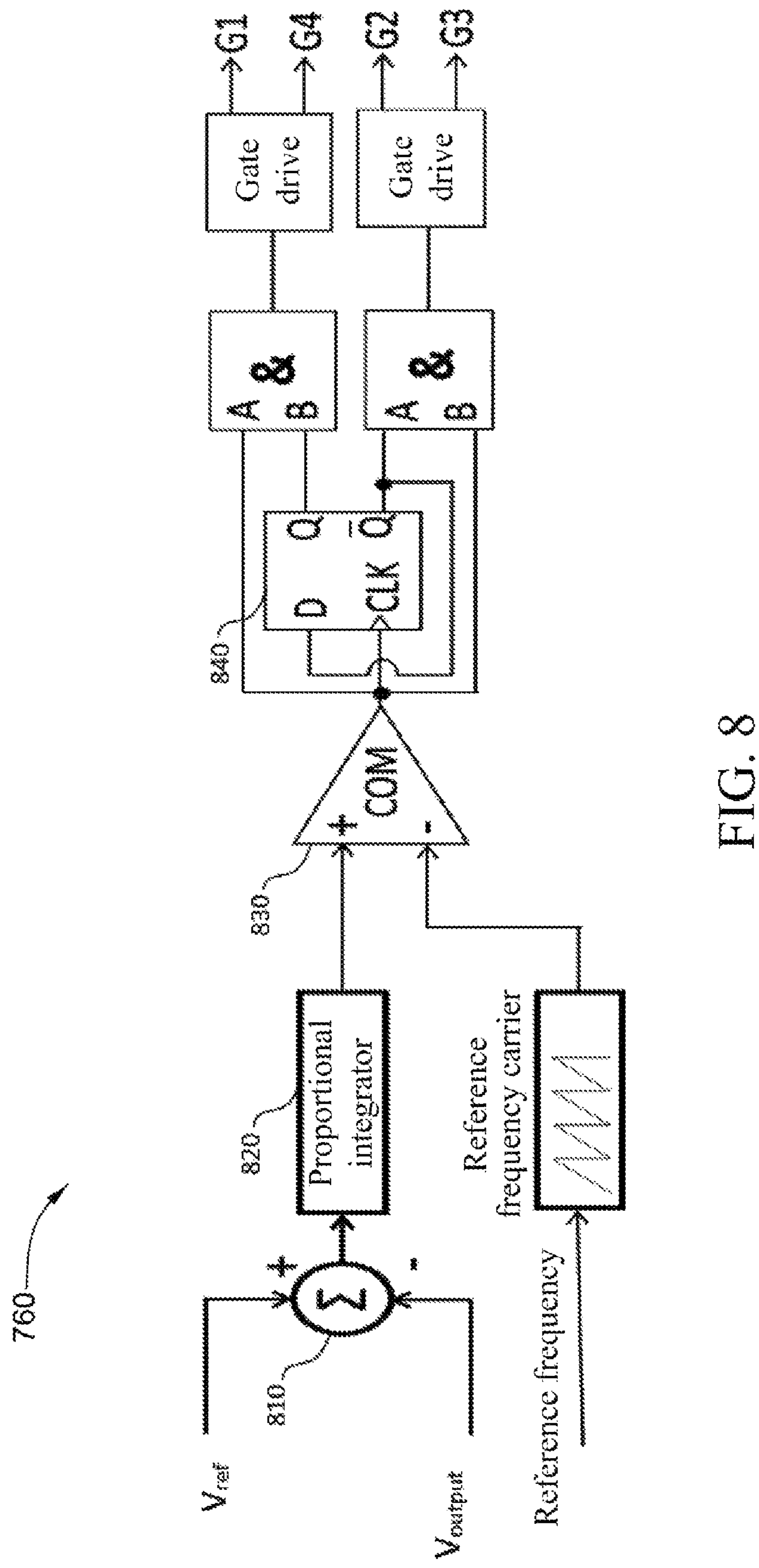
FIG. 8 is a schematic structural diagram of one embodiment of a controller 760 in FIG. 7.

Referring to FIG. 8, a schematic structural diagram of one embodiment of the controller 760 is illustrated, including a voltage AND-OR operator 810 used to receive a load feedback voltage $V_{output}$ and a reference voltage $V_{ref}$. The AND-OR operator 810 is connected to a proportional integrator 820, which is used to output a pulse width modulation waveform having an adjusted duty cycle to a positive input terminal of a comparator 830 when the load feedback voltage $V_{output}$ is different from the reference voltage $V_{ref}$. A negative input terminal of the comparator 830 is used to receive a reference frequency carrier. The comparator 830 is used to output a frequency comparison result of the pulse width modulation waveform and the carrier, such that a drive module 840 adjusts a clock frequency CLK on the basis of the comparison result. The drive module 840 outputs drive signals G1-G4 according to the duty cycle of the pulse width modulation waveform and the clock frequency, so as to control the on/off time of the field-effect transistor switches S1-S4, respectively, further controlling the magnitude of the output voltage, wherein the field-effect transistor switches S1 and S4 are turned on simultaneously, the field-effect transistor switches S2 and S3 are turned on simultaneously, and the level states of the field-effect transistor switches S1 and S4 are always opposite to the level states of the field-effect transistor switches S2 and S3. In this way, the periodic voltage signal is generated, which is specifically a square wave signal.

Figure 9:
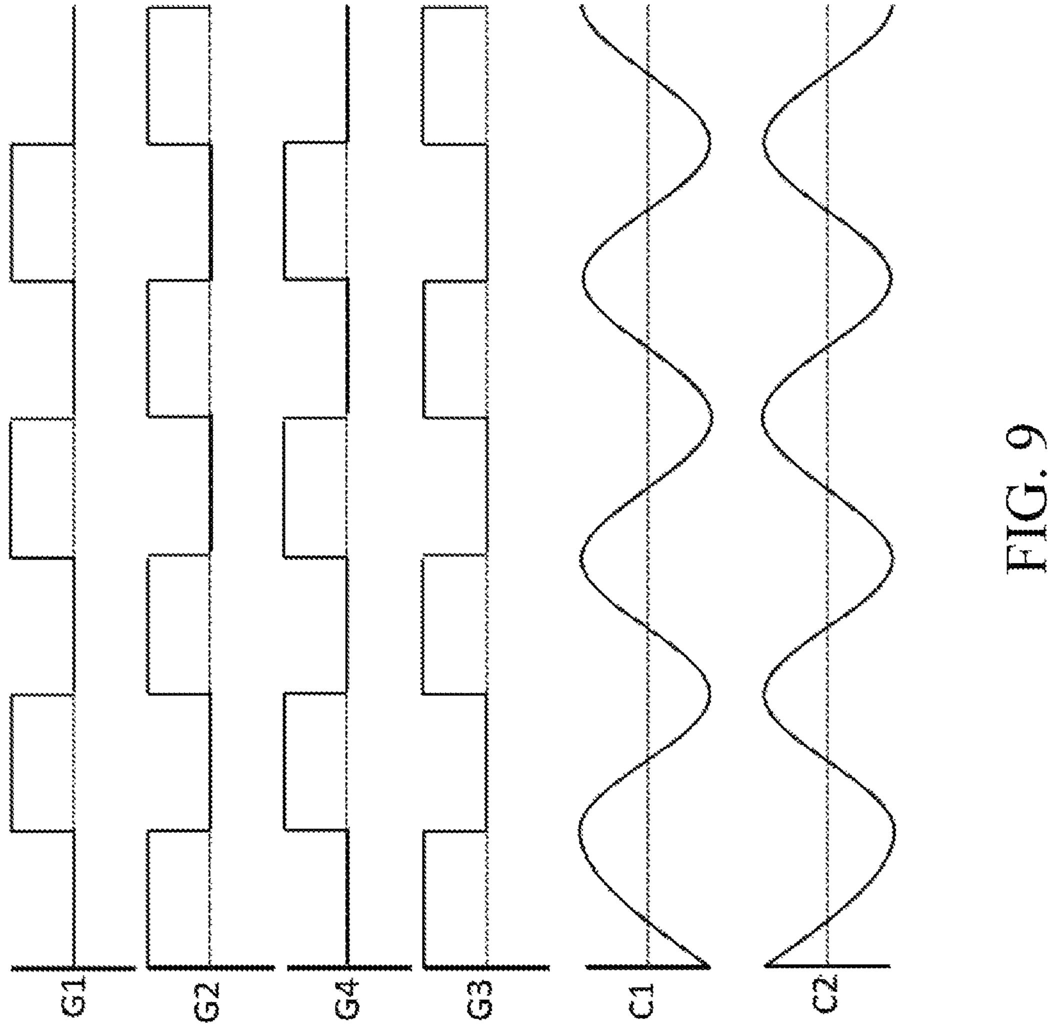
FIG. 9 illustrates one example of control timing for field-effect transistor switches S1-S4 in FIG. 5.

Referring to FIG. 9, one example of control timing of the field-effect transistor switches S1-S4 is illustrated, wherein when the four drive signals G1-G4 are at high levels, the corresponding field-effect transistor switches are turned on, and otherwise the corresponding field-effect transistor switches are turned off. FIG. 10 further illustrates the change in voltage of the first capacitor C1 and the second capacitor C3 in the corresponding timing.

In some embodiments, at least one of a device parameter of the resonant circuit 420 (e.g., the inductance of an inductive element and the capacitance of a capacitive element therein) and the pulse-width modulated switch switching frequency may be determined according to the input voltage of the full-bridge circuit 420 (e.g., provided by means of the DC power source 410), the rated power of the load, and the number of stages of the boost circuit (e.g., the number N of the above-described third capacitors).

In embodiments of the present invention, a switching frequency of the controller 760 for the plurality of field-effect transistor switches S1-S4 is outside of an operating frequency range of the magnetic resonance system, so as to avoid interfering with the image signal and thus affecting image quality.

Figure 10:
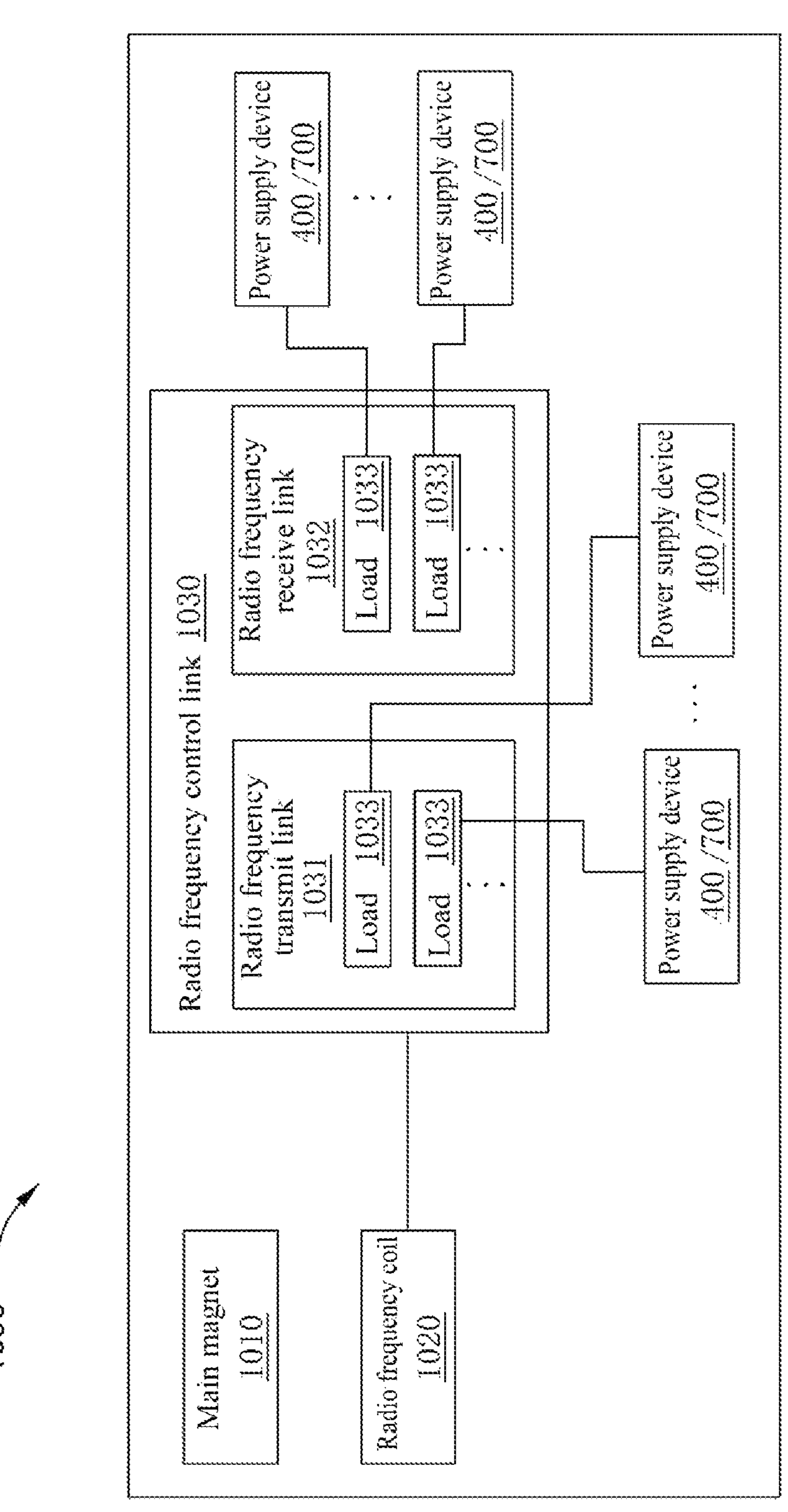
FIG. 10 illustrates a block diagram of a magnetic resonance system 1000 provided by another embodiment of the present invention.

FIG. 10 is a block diagram of a magnetic resonance system 1000 provided by another embodiment of the present invention, wherein the magnetic resonance system 1000 may be similar to the structure of the system 100 shown in FIG. 1, for example, including some or all of the components of the system shown in FIG. 1. The magnetic resonance system 1000 includes a main magnet 1010, a radio frequency coil 1020, and a radio frequency control link 1030. The radio frequency coil 1020 may include at least one of a body coil, a local coil, and a receive coil. The radio frequency control link 1030 includes at least one of a radio frequency transmit link 1031 and a radio frequency receive link 1032, wherein both the radio frequency transmit link 1031 and the radio frequency receive link 1032 may include one or more loads 1033 to be powered. The magnetic resonance system 1000 may further include the power supply device 400 or 700 provided in any embodiment of the present invention for supplying power to the one or more loads 1033.

Furthermore, the main magnet 1010, the radio frequency coil 1020, the one or more loads 1033 of the radio frequency control link 1030, and the power supply device thereof are all disposed in a magnet room. Specifically, the power supply device may be disposed in a housing accommodating the main magnet 1010.

Based on the above description, an embodiment of the present invention may provide a power supply device for a magnetic resonance system, including a DC power source, a full-bridge circuit, a resonant circuit, and a boost circuit. The full-bridge circuit is coupled to the DC power source. The full-bridge circuit has a first bridge arm and a second bridge arm, and the full-bridge circuit is used to output a periodic voltage signal through the first bridge arm and the second bridge arm. The resonant circuit has a symmetrical circuit structure, wherein two symmetric input terminals are connected to the first bridge arm and the second bridge arm, respectively, so as to receive the periodic voltage signal. The boost circuit is connected to two symmetric output terminals of the resonant circuit so as to receive the periodic voltage signal modulated by the resonant circuit, the boost circuit being used to provide a boosted voltage having an amplitude greater than the amplitude of the periodic voltage signal.

The resonant circuit may include a first inductor, a first capacitor, a second capacitor, and a second inductor, one end of the first inductor being connected to the first bridge arm, one end of the second inductor being connected to the second bridge arm, the other end of the first inductor being connected sequentially in series to the first capacitor and the second capacitor, and then connected to the other end of the second inductor, the other ends of the first inductor and the second inductor serving as the two symmetric output terminals, respectively, and a connection node of the first capacitor and the second capacitor being grounded.

The boost circuit may include a symmetrical circuit structure, the symmetrical circuit structure including a first boost portion and a second boost portion, the first boost portion and the second boost portion being connected to the two symmetric output terminals of the resonant circuit, respectively, and the first boost portion and the second boost portion being used to produce divided voltages of the boosted voltage.

The first boost portion includes a plurality of third capacitors, a plurality of fifth capacitors, a plurality of first diodes, and a plurality of second diodes. The second boost portion may include a plurality of fourth capacitors, the plurality of fifth capacitors, a plurality of third diodes, and a plurality of fourth diodes. A negative electrode of each third capacitor is connected to an anode of one first diode and a cathode of one second diode, each third capacitor corresponds to one fourth capacitor, a negative electrode of the fourth capacitor corresponding to each third capacitor is connected to an anode of one third diode and a cathode of one fourth diode, cathodes of each first diode and a corresponding third diode are connected to each other and then connected to a positive electrode of one fifth capacitor, and anodes of each second diode and a corresponding fourth diode are connected to each other and then connected to a negative electrode of one fifth capacitor.

The power supply device may further include an energy storage capacitor. Both the first boost portion and the second boost portion are connected to a positive electrode of the energy storage capacitor, so as to provide the boosted voltage to the energy storage capacitor.

A fifth diode may be connected between the first boost portion and second boost portion, and the energy storage capacitor.

The first inductor and the second inductor may be wound to form a coupled inductor.

The first inductor and the second inductor are wound and extended to form a ring shape.

The coupled inductor may include an annular carrier, the first inductor and the second inductor each being wound in parallel along the entire periphery of the annular carrier in multiple turns.

The power supply device may further include a controller for controlling the full-bridge circuit to output the periodic voltage signal.

The full-bridge circuit may include a plurality of field-effect transistor switches. The controller is used to switch the plurality of field-effect transistor switches between on and off, wherein a switching frequency of the controller for the plurality of field-effect transistor switches is outside an operating frequency range of the magnetic resonance system.

The power supply device may be integrated in a resonance assembly of the magnetic resonance system.

One embodiment of the present invention further provides a magnetic resonance system, including a main magnet, a radio frequency coil, a radio frequency control link, and the power supply device according to any embodiment described above. The radio frequency coil may include at least one of a radio frequency transmit link and a radio frequency receive link. The power supply device is used to supply power to one or more loads in the radio frequency control link.

The main magnet, the radio frequency coil, and the one or more loads of the radio frequency control link and the power supply device thereof are all disposed in a magnet room.

The power supply device is disposed in a housing accommodating the main magnet.

While the present invention has been described in detail with reference to specific embodiments, it would be understood by those skilled in the art that many modifications and variations can be made to the present invention. Therefore, it should be understood that the claims are intended to cover all such modifications and variations within the true spirit and scope of the present invention.

The invention claimed is:

1. A power supply device for a magnetic resonance system, comprising:

a DC power source;

a full-bridge circuit coupled to the DC power source and having a first bridge arm and a second bridge arm, the full-bridge circuit being used to output a periodic voltage signal through the first bridge arm and the second bridge arm;

a resonant circuit, having a symmetrical circuit structure, wherein two symmetric input terminals are directly connected to the first bridge arm and the second bridge arm, respectively, so as to receive the periodic voltage signal, wherein the resonant circuit comprises a first inductor, a first capacitor, a second capacitor and a second inductor, one end of the first inductor being directly connected to the first bridge arm, one end of the second inductor being directly connected to the second bridge arm, the other end of the first inductor being connected sequentially in series to the first capacitor and the second capacitor, and then connected to the other end of the second inductor, the other ends of the first inductor and the second inductor serving as the two symmetric output terminals, respectively, and a connection node of the first capacitor and the second capacitor being grounded, and wherein the first inductor and the second inductor serve as the two symmetric input terminals; and a boost circuit, connected to two symmetric output terminals of the resonant circuit so as to receive the periodic voltage signal modulated by the resonant circuit, the boost circuit being used to provide a boosted voltage, and the boosted voltage having an amplitude greater than the amplitude of the periodic voltage signal, wherein the power supply device is configured to provide power to one or more loads of a radio frequency control link of the magnetic resonance system.

2. The device according to claim 1, wherein the boost circuit comprises a symmetrical circuit structure, the symmetrical circuit structure comprising a first boost portion and a second boost portion, the first boost portion and the second boost portion being connected to the two symmetric output terminals of the resonant circuit, respectively, and the first boost portion and the second boost portion being used to produce divided voltages of the boosted voltage.

3. The device according to claim 2, wherein the first boost portion comprises a plurality of third capacitors, a plurality of fifth capacitors, a plurality of first diodes and a plurality of second diodes, and the second boost portion comprises a plurality of fourth capacitors, the plurality of fifth capacitors, a plurality of third diodes and a plurality of fourth diodes, a negative electrode of each third capacitor being connected to an anode of a first diode and a cathode of a second diode, each third capacitor corresponding to one fourth capacitor, a negative electrode of the fourth capacitor corresponding to each third capacitor being connected to an anode of a third diode and a cathode of a fourth diode, cathodes of each first diode and a corresponding third diode being connected to each other and then connected to a positive electrode of a fifth capacitor, and anodes of each second diode and a corresponding fourth diode being connected to each other and then connected to a negative electrode of a fifth capacitor.

4. The device according to claim 2, further comprising an energy storage capacitor, wherein both the first boost portion and the second boost portion are connected to a positive electrode of the energy storage capacitor so as to provide the boosted voltage to the energy storage capacitor.

5. The device according to claim 4, wherein a fifth diode is connected between the first boost portion and second boost portion, and the energy storage capacitor.

6. The device according to claim 1, wherein the first inductor and the second inductor are wound to form a coupled inductor.

7. The device according to claim 6, wherein the first inductor and the second inductor are wound and extended to form a ring shape.

8. The device according to claim 7, wherein the coupled inductor comprises an annular carrier, and the first inductor and the second inductor are each wound in parallel along the entire periphery of the annular carrier in multiple turns.

9. The device according to claim 1, further comprising a controller, for controlling the full-bridge circuit to output the periodic voltage signal.

10. The device according to claim 9, wherein the full-bridge circuit comprises a plurality of field-effect transistor switches, and the controller is used to switch the plurality of field-effect transistor switches between on and off, wherein a switching frequency of the controller for the plurality of field-effect transistor switches is outside of an operating frequency range of the magnetic resonance system.

11. The device according to claim 1, wherein the power supply device is integrated in a resonance assembly of the magnetic resonance system.

12. A magnetic resonance system, comprising:

a main magnet;

a radio frequency coil;

a radio frequency control link, comprising at least one of a radio frequency transmit link and a radio frequency receive link; and the power supply device of claim 1, for supplying power to the one or more loads in the radio frequency control link.

13. The magnetic resonance system according to claim 12, wherein the main magnet, the radio frequency coil, the one or more loads of the radio frequency control link, and the power supply device thereof are all disposed in a magnet room.

14. The magnetic resonance system according to claim 12, wherein the power supply device is disposed in a housing accommodating the main magnet.

* * * * *